United States Patent
Yang et al.

(10) Patent No.: US 10,249,843 B2
(45) Date of Patent: Apr. 2, 2019

(54) DISPLAY DEVICE WITH LIGHT TRANSMISSION AREA

(71) Applicant: Samsung Display Co., Ltd., Yongin-si (KR)

(72) Inventors: Hui-Won Yang, Seoul (KR); Hyeon Sik Kim, Yongin-si (KR); Hye Hyang Park, Yongin-si (KR); Eun Young Lee, Seoul (KR); Joo Hee Jeon, Anyang-si (KR)

(73) Assignee: Samsung Display Co., Ltd., Yongin-si (KR)

(*) Notice: Subject to any disclaimer, the term of this patent is extended or adjusted under 35 U.S.C. 154(b) by 159 days.

(21) Appl. No.: 15/269,184

(22) Filed: Sep. 19, 2016

(65) Prior Publication Data
US 2017/0092894 A1    Mar. 30, 2017

(30) Foreign Application Priority Data
Sep. 25, 2015 (KR) .................. 10-2015-0136923

(51) Int. Cl.
*H01L 51/52* (2006.01)
*H01L 27/32* (2006.01)
*H01L 51/00* (2006.01)

(52) U.S. Cl.
CPC ........ *H01L 51/5253* (2013.01); *H01L 27/326* (2013.01); *H01L 51/0097* (2013.01)

(58) Field of Classification Search
CPC ................ H01L 51/5253; H01L 27/326; H01L 51/0097
See application file for complete search history.

(56) References Cited

U.S. PATENT DOCUMENTS

| | | | |
|---|---|---|---|
| 6,919,282 B2 | 7/2005 | Sakama et al. | |
| 2006/0290851 A1 | 12/2006 | Kim et al. | |
| 2009/0027579 A1 | 1/2009 | Aota et al. | |
| 2011/0204369 A1* | 8/2011 | Ha | H01L 51/5228 257/59 |
| 2011/0205198 A1* | 8/2011 | Jeong | H01L 27/326 345/205 |
| 2011/0207254 A1 | 8/2011 | Lee | |
| 2012/0267611 A1* | 10/2012 | Chung | H01L 27/3211 257/40 |
| 2014/0183479 A1* | 7/2014 | Park | H01L 51/56 257/40 |

FOREIGN PATENT DOCUMENTS

| | | |
|---|---|---|
| JP | 2009-031468 A | 2/2009 |
| KR | 10-2006-0134289 A | 12/2006 |
| KR | 10-2011-0097381 A | 8/2011 |

* cited by examiner

*Primary Examiner* — Kyoung Lee
(74) *Attorney, Agent, or Firm* — H.C. Park & Associates, PLC

(57) ABSTRACT

A display device includes a substrate including a first area displaying an image and a second area adjacent to the first area, the second area transmitting external light, a first electrode and a second electrode disposed in the first area and overlapping each other, an emission layer disposed between the first electrode and the second electrode in the first area, a first semiconductor layer disposed in the first area, and a second semiconductor layer disposed in the second area.

27 Claims, 12 Drawing Sheets

DISPLAY DEVICE WITH LIGHT TRANSMISSION AREA

CROSS-REFERENCE TO RELATED APPLICATION

This application claims priority from and the benefit of Korean Patent Application No. 10-2015-0136923, filed on Sep. 25, 2015, which is hereby incorporated by reference for all purposes as if fully set forth herein.

BACKGROUND

Field

Exemplary embodiments relate to a display device, and, more particularly, to a display device including a display area and a transmission area.

Discussion of the Background

Display devices may include a liquid crystal display (LCD), a plasma display panel (PDP), an organic light emitting diode (OLED) device, and the like. Among them, since the OLED device has a self-luminance characteristic and does not require a separate light source, unlike the liquid crystal display, thickness and weight thereof may be reduced. Further, the organic light emitting diode device has high-grade characteristics, such as low power consumption, high luminance, and a high response speed.

A display device may include a display area for displaying an image and a transmission area for transmitting external light. Many efforts have been made to improve the transmittance of light in the transmission area. In addition, when external moisture or a pollution material infiltrates the display device, a display quality of the display device may be deteriorated.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device including a display area and a transmission area having increased transmittance, and having decreased defects due to external moisture intrusion.

Additional aspects will be set forth in the detailed description which follows, and, in part, will be apparent from the disclosure, or may be learned by practice of the inventive concept.

According to an exemplary embodiment, a display device includes a substrate including a first area displaying an image and a second area adjacent to the first area, the second area being configured to transmit external light, a first electrode and a second electrode disposed in the first area and overlapping each other, an emission layer disposed between the first electrode and the second electrode in the first area, a first semiconductor layer disposed in the first area, and a second semiconductor layer disposed in the second area.

According to an exemplary embodiment, a display device includes a substrate including a first area configured to display an image and a second area adjacent to the first area, the second area configured to transmit external light, a first electrode and a second electrode disposed in the first area and overlapping each other, an emission layer disposed between the first electrode and the second electrode in the first area, a semiconductor layer disposed in the first area, and insulating layers disposed on the semiconductor layer, in which the insulating layers includes a hole disposed in the second area, the hole includes a first hole portion and a second hole portion adjacent to the first hole portion, the first hole portion being adjacent to the substrate, and the width of the first hole portion is greater than the width of the second hole portion.

The edge of the hole may overlap the second semiconductor layer.

The display device may further include a buffer layer formed on the substrate, and the second semiconductor layer may be disposed on the buffer layer.

The buffer layer overlapping the hole may be covered by the second semiconductor layer.

The display device may further include a buffer layer formed on the substrate, and the buffer layer is disposed on the first area and the second area.

According to an exemplary embodiment, a display device includes a substrate including a first area configured to display an image and a second area adjacent to the first area, a buffer layer disposed on the substrate, a semiconductor layer disposed on the buffer layer, a first electrode and a second electrode disposed in the first area and overlapping each other, and an emission layer disposed between the first electrode and the second electrode in the first area, in which the semiconductor layer is disposed directly on the buffer layer.

The semiconductor layer may include an oxide semiconductor.

The substrate may be flexible.

According to exemplary embodiments, the transmittance of the display device including the display area and the transmission area may be improved and defects due to external moisture may be prevented.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
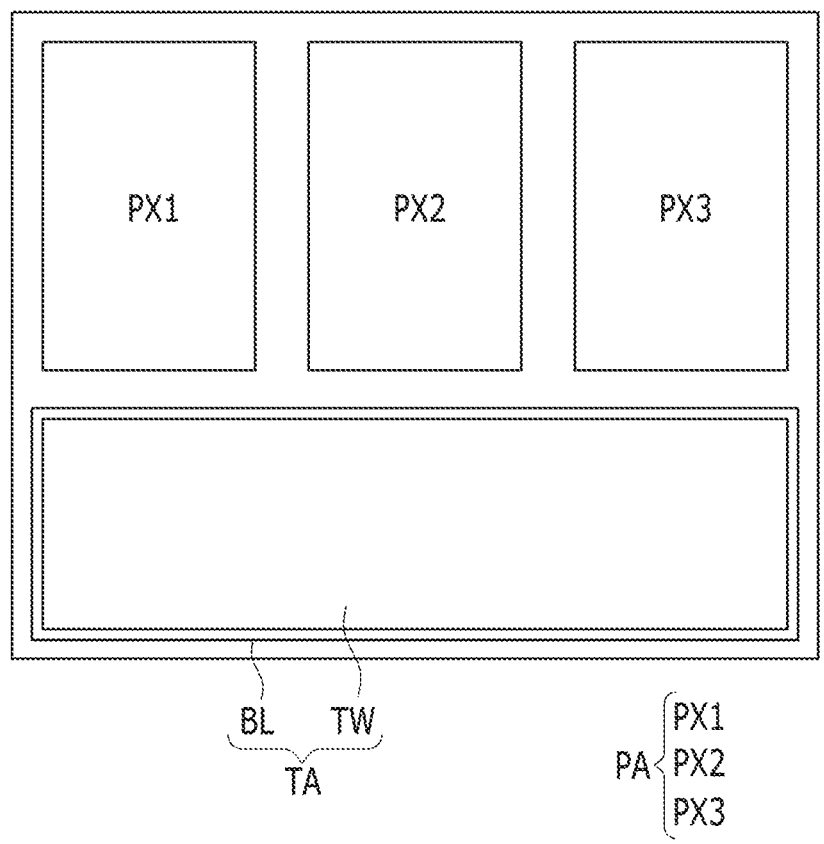
FIG. 1 is a layout view of a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
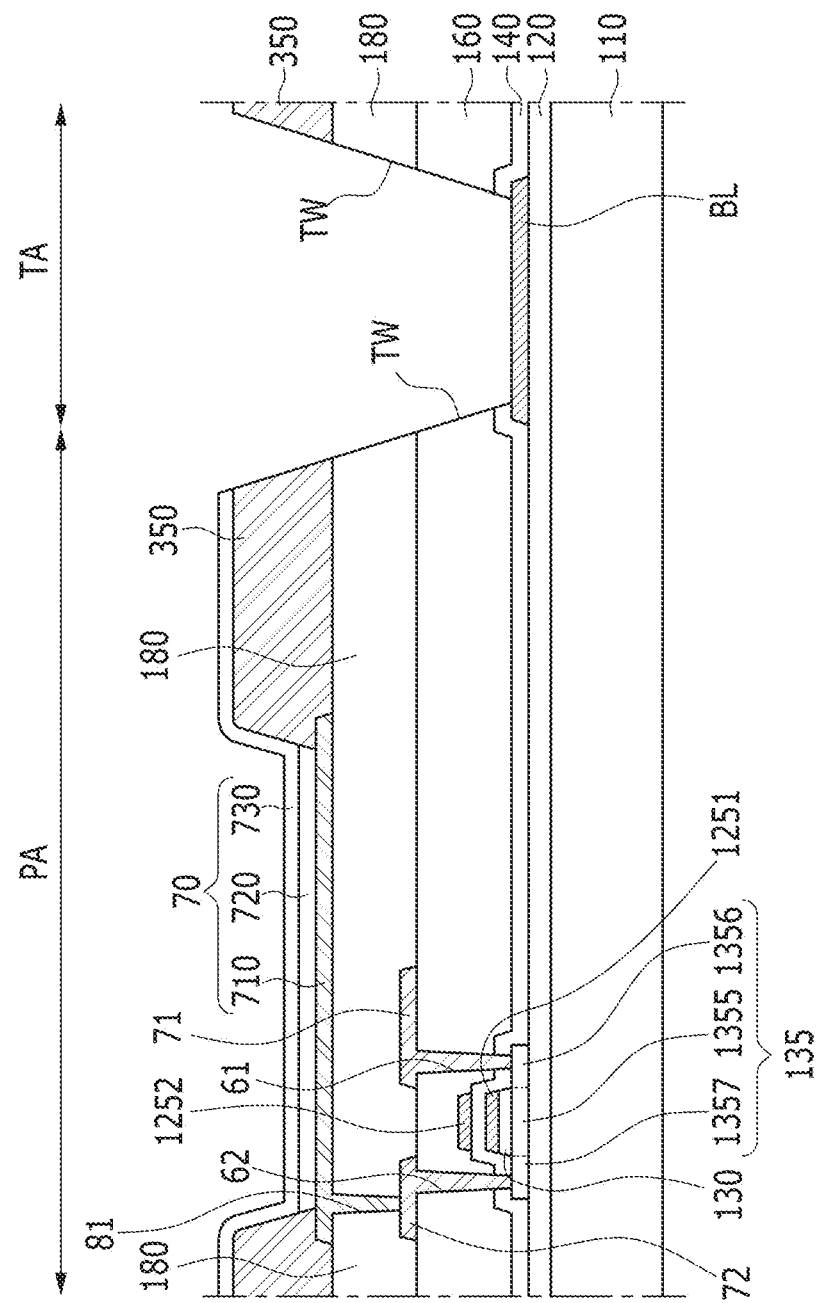
FIG. 2 is a cross-sectional view of a display device according to an exemplary embodiment.

A display device according to an exemplary embodiment will be described with reference to FIG. 1 and FIG. 2. FIG. 1 is a layout view of a display device according to an exemplary embodiment. FIG. 2 is a cross-sectional view of a display device according to an exemplary embodiment.

Referring to FIG. 1, the display device according to the present exemplary embodiment includes a display area PA for displaying an image and a transmission area TA for transmitting light.

The display area PA includes pixels PX1, PX2, and PX3. The pixels PX1, PX2, and PX3 may display different colors from each other, and the pixels PX1, PX2, and PX3 may form one dot. The pixels PX1, PX2, and PX3 may include a first pixel PX1 displaying a first color, a second pixel PX2 displaying a second color, and a third pixel PX3 displaying a third color. Although not shown, the display device according to an exemplary embodiment may further include other pixels as well as the first pixel PX1, the second pixel PX2, and the third pixel PX3.

The transmission area TA is an area for transmitting light. A blocking layer BL and a transmitting window TW are formed in the transmission area TA.

A ratio of the area of the transmission area TA to the entire area of the display area PA and the transmission area TA may be about 20% to about 70%.

According to the present exemplary embodiment, the blocking layer BL and the transmitting window TW of the transmission area TA correspond to the pixels PX1, PX2, and PX3. It is noted that, however, the blocking layer BL and the transmitting window TW of the transmission area TA may be independently formed on each pixel area.

Referring to FIG. 2, the transmission area TA includes a buffer layer 120 disposed on a substrate 110, a blocking layer BL disposed on the buffer layer 120, and a transmitting window TW overlapping the blocking layer BL. External light may pass through the transmitting window TW, and, thus, the display device may be considered as a transparent display device.

The substrate 110 may be flexible, and may include an organic material, an inorganic material, a glass, or a metal, such as a stainless steel. The substrate 110 may be flexible and may be stretchable, foldable, bendable, or rollable. Since the substrate 110 is flexible, stretchable, foldable, bendable, or rollable, the display device may be flexible, stretchable, foldable, bendable, or rollable.

The transmitting window TW is an opening, which is formed in insulating layers, such as a second insulating layer 140, an interlayer insulating layer 160, a planarization layer 180, and a pixel defining layer 350 disposed in the display area PA and the transmission area TA. The insulating layers 140, 160, 180, and 350 will be described in more detail below. An edge of the transmitting window TW closest to the substrate 110 overlaps the blocking layer BL. In a top view from the direction perpendicular to the surface of the substrate 110, an edge of the blocking layer BL is protruded from the edge of the transmitting window TW adjacent to the substrate 110. Accordingly, a portion of the buffer layer 120 overlapping the transmitting window TW is covered by the blocking layer BL. That is, the buffer layer 120 is not exposed by the transmitting window TW.

The blocking layer BL may include an oxide semiconductor.

The display area PA includes the substrate 110, the buffer layer 120 disposed on the substrate 110, and a semiconductor layer 135 disposed on the buffer layer 120. The semiconductor layer 135 includes a channel region 1355, a source region 1356, and a drain region 1357. The display area PA further includes a first insulating layer 130 disposed on the semiconductor layer 135, a first control electrode 1251 disposed on the first insulating layer 130, s a second insulating layer 140 disposed on a first control electrode 1251, a second control electrode 1252 disposed on the second insulating layer 140, an interlayer insulating layer 160 disposed on the second control electrode 1252. The display area PA further includes a source electrode 71 and a drain electrode 72 respectively connected to the source region 1356 and the drain region 1357 through a first contact hole 61 and a second contact hole 62 formed in the second insulating layer 140 and the interlayer insulating layer 160, a planarization layer 180 disposed on the drain electrode 72, a pixel electrode 710 connected to the drain electrode 72 through a third contact hole 81 formed in the planarization layer 180, a pixel defining layer 350 formed on the pixel electrode 710, an organic emission layer 720 disposed at the opening formed in the pixel defining layer 350, and a common electrode 730 disposed on the organic emission layer 720.

Figure 3:
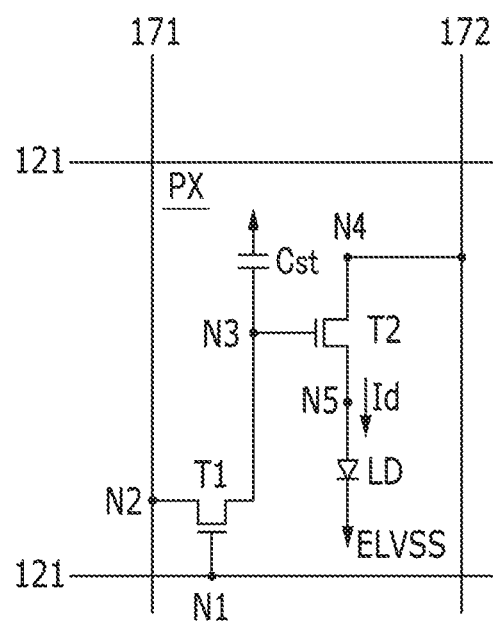
FIG. 3 is an equivalent circuit diagram of one pixel of a display device according to an exemplary embodiment.
Figure 4:
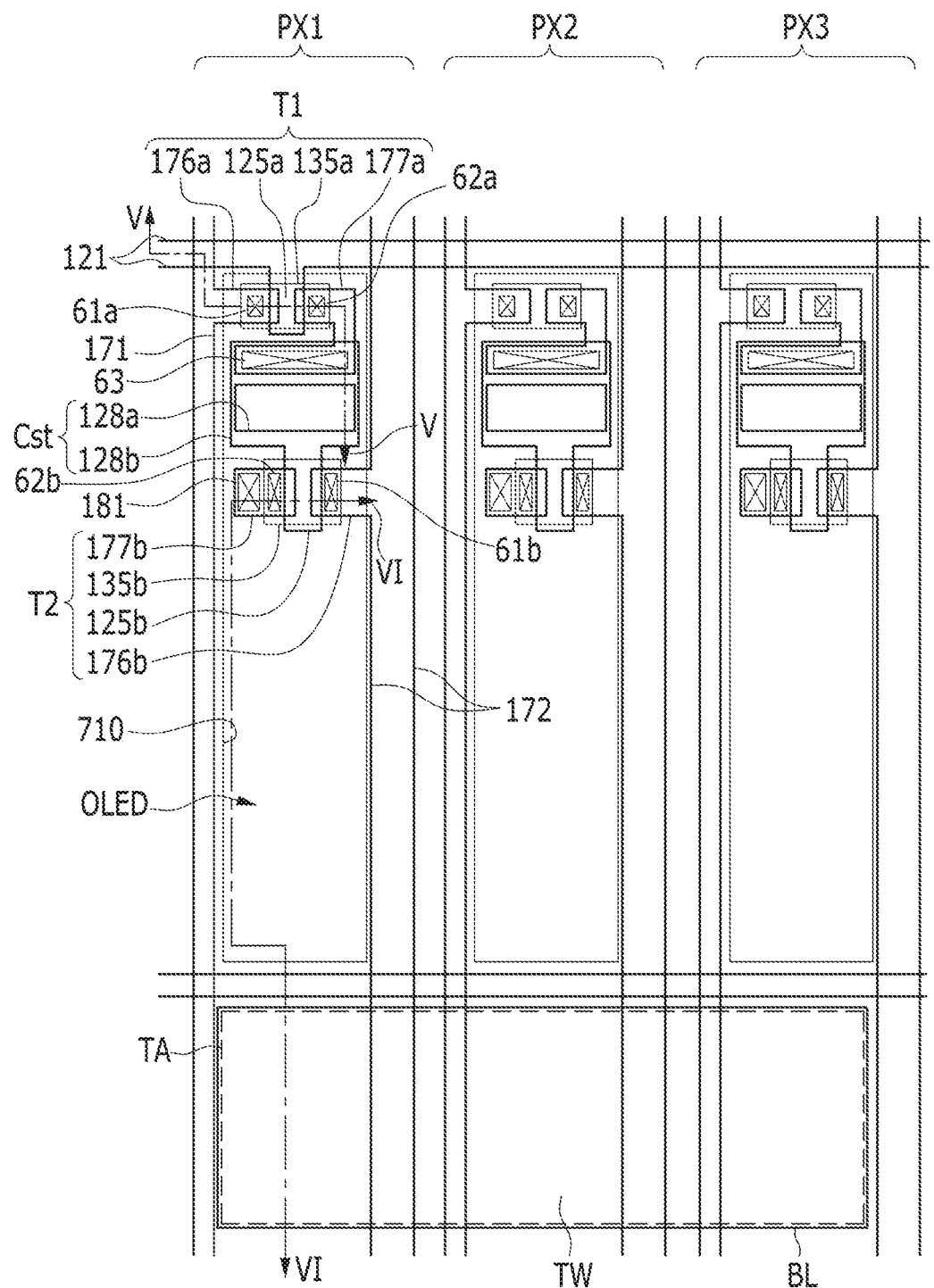
FIG. 4 is a layout view showing pixel areas of a display device according to an exemplary embodiment.
Figure 5:
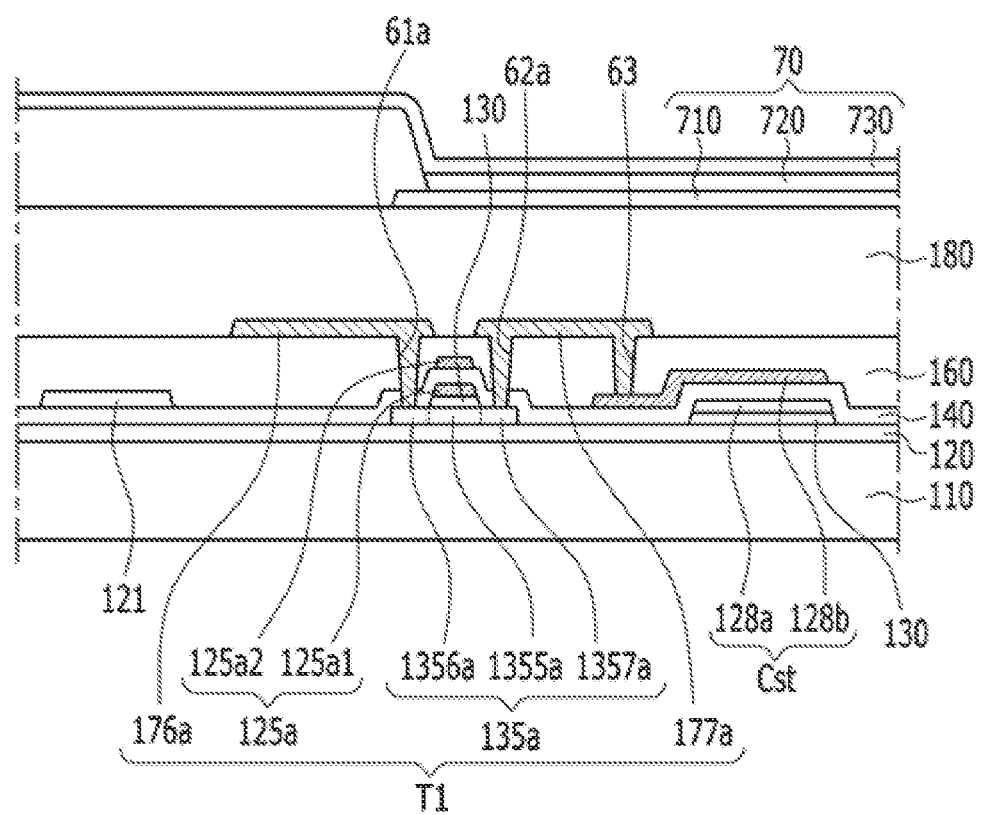
FIG. 5 is a cross-sectional view of the display device of FIG. 4 taken along line V-V'.
Figure 6:
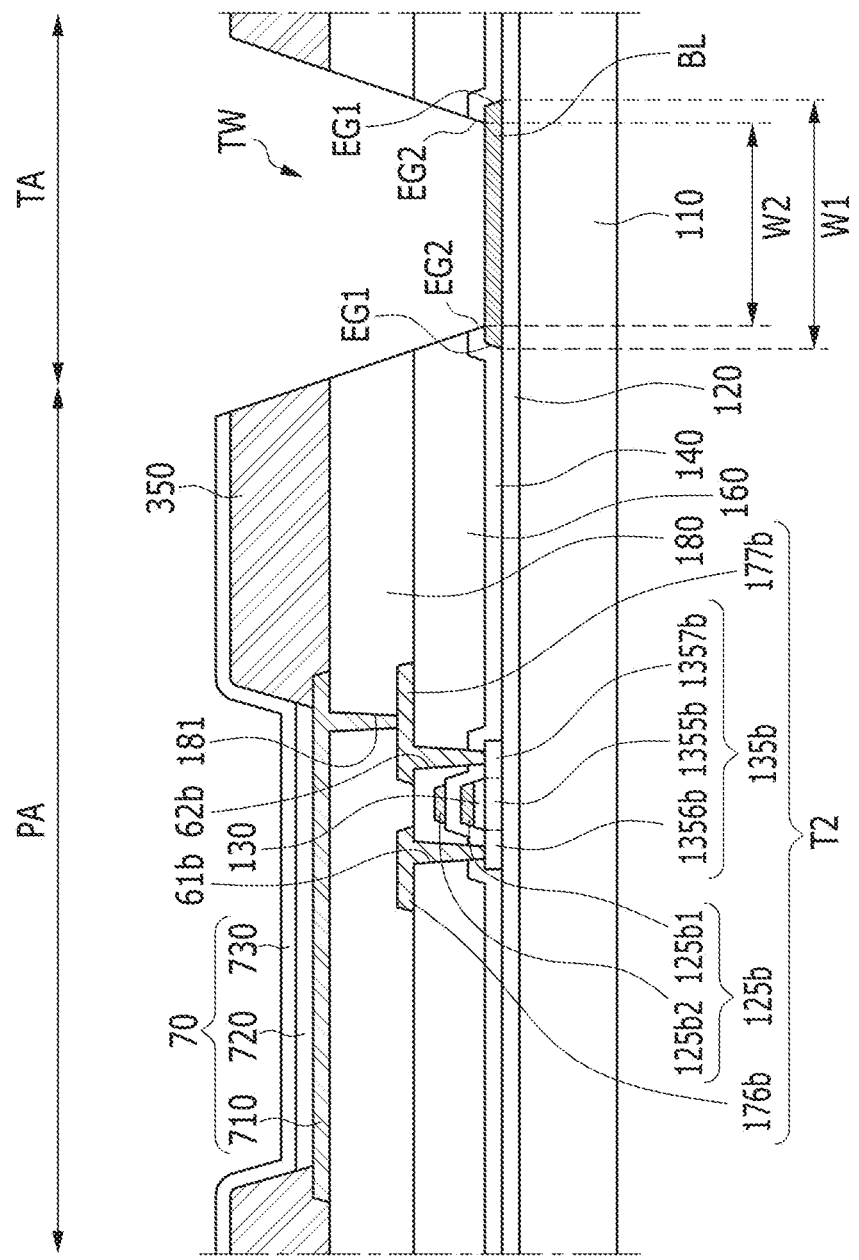
FIG. 6 is a cross-sectional view of the display device of FIG. 4 taken along line VI-VI'.

A display device according to the exemplary embodiments as shown in FIG. 1 and FIG. 2 will be described with reference to FIG. 3 to FIG. 6. FIG. 3 is an equivalent circuit diagram of one pixel of a display device according to an exemplary embodiment. FIG. 4 is a layout view showing pixel areas of a display device according to an exemplary embodiment. FIG. 5 is a cross-sectional view of the display device of FIG. 4 taken along line V-V'. FIG. 6 is a cross-sectional view of the display device of FIG. 4 taken along line VI-VI'.

A connection relation of signal lines of the pixel PX of the display device according to the present exemplary embodiment will be described with reference to FIG. 3.

Referring to FIG. 3, the display device according to the present exemplary embodiment includes signal lines 121, 171, and 172 and a pixel PX connected thereto. The pixel PX may be any one of a first pixel PX1, a second pixel PX2, and a third pixel PX3 of FIG. 1.

The signal lines include gate lines 121 for transmitting a scanning signal, a data line 171 for transmitting a data signal, a driving voltage line 172 for transmitting a driving voltage, and the like. The gate lines 121 substantially extend in a row direction and are substantially parallel to each other. The data lines 171 substantially extend in a column direction and are substantially parallel to each other. The driving voltage lines 172 are illustrated to substantially extend in the column direction, but the driving voltage lines 172 may extend in the row or column direction, or have a net-like shape including a portion extending in the first direction and a portion extending in the second direction.

A single subpixel includes a thin-film transistor including a switching transistor T1 and a driving transistor T2, a storage capacitor Cst, and an organic light emitting element LD. Although not illustrated in the drawings, one pixel PX may further include a second thin-film transistor and a second capacitor to compensate the current supplied to the organic light emitting element LD.

The switching transistor T1 includes a control terminal N1, an input terminal N2, and an output terminal N3. The control terminal N1 is connected to the gate line 121, the input terminal N2 is connected to the data line 171, and the output terminal N3 is connected to the driving transistor T2.

The switching transistor T1 transmits the data signal transmitted via the data line 171 to the driving transistor T2, in response to the scanning signal transmitted via the gate line 121.

The driving transistor T2 includes a control terminal N3, an input terminal N4, and an output terminal N5. The control terminal N3 is connected to the switching transistor T1, the input terminal N4 is connected to the driving voltage line 172, and the output terminal N5 is connected to the organic light emitting element LD.

The driving transistor T2 outputs an output current Id, a magnitude of which varies according to a voltage applied between the control terminal N3 and the output terminal N5.

The capacitor Cst is connected to the control terminal N3 of the driving transistor T2. The capacitor Cst is charged with a data signal applied to the control terminal N3 of the driving transistor T2, and maintains the data signal even after the switching transistor T1 is turned off.

For example, as an organic light emitting diode (OLED), the organic light emitting element LD has an anode connected to the output terminal N5 of the driving transistor T2 and a cathode connected to a common voltage ELVSS. The organic light emitting element LD displays an image by emitting light of varying intensities according to the output current Id of the driving transistor T2.

The organic light emitting element LD may include an organic material that represents one or more of primary colors, including three of which may be red, green, and blue. In this manner, the organic light emitting diode display may display a desired image with a spatial sum of these colors.

The switching transistor T1 and the driving transistor T2 are n-channel field effect transistors (FETs), but at least one of them may be a p-channel FET. It is noted that, however, the connection relationship between the transistors T1 and T2, the capacitor Cst, and the organic light emitting element LD may be varied.

Hereinafter, the transmission area TA and the display area PA of the organic light emitting diode display according to the present exemplary embodiment will be described with reference to FIG. 4 to FIG. 6.

First, the transmission area TA will be described.

The transmission area TA includes the buffer layer 120 disposed on the substrate 110, the blocking layer BL disposed on the buffer layer 120, and the transmitting window TW overlapping the blocking layer BL.

The blocking layer BL includes an oxide semiconductor. The oxide semiconductor may include one of oxides based on titanium (Ti), hafnium (Hf), zirconium (Zr), aluminum (Al), tantalum (Ta), germanium (Ge), zinc (Zn), gallium (Ga), tin (Sn), or indium (In), indium-gallium-zinc oxide (In—Ga—Zn—O), indium-zinc oxide (In—Zn—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium gallium oxide (In—Ge—Ga—O), titanium-indium-zinc oxide (Ti—In—Zn—O), and hafnium-indium-zinc oxide (Hf—In—Zn—O), which are complex oxides thereof.

The transmitting window TW is an opening, which is formed in insulating layers, such as the second insulating layer 140, the interlayer insulating layer 160, the planarization layer 180, and the pixel defining layer 350 disposed in the display area PA and the transmission area TA. The transmitting window TW is formed to penetrate the second insulating layer 140, the interlayer insulating layer 160, the planarization layer 180, and the pixel defining layer 350. The insulating layers formed with the transmitting window TW will be described in detail later.

External light incident onto the transmitting window TW passes the transmitting window TW, and, thus, the organic light emitting diode display according to the exemplary embodiment may be recognized as a transparent display device.

The edge of the transmitting window TW overlaps the blocking layer BL.

In a top view from the direction perpendicular to the surface of the substrate 110, the first edge EG1 of the blocking layer BL is protruded from the second edge EG2 of the transmitting window TW adjacent to the substrate 110. In this manner, the buffer layer 120 overlapping the transmitting window TW is covered by the blocking layer BL. That is, the buffer layer 120 is not exposed through the transmitting window TW.

As the transmitting window TW according to the present exemplary embodiment is formed in the insulating layers disposed in the transmission area TA, external light incident thereto may not pass through the insulating layer, but passes through the transmitting window TW, thereby increasing the light transmittance of the transmission area TA. Further, when forming the transmitting window TW, which is formed in the insulating layers disposed in the transmission area TA, the buffer layer 120 may be etched and damaged, which may cause penetration of unnecessary component, such as impurities or moisture, which may deteriorate the quality of the display device.

In a display device according to the present exemplary embodiment, the transmitting window TW is formed to overlap the blocking layer BL, such that a second width W2 between the second edges EG2 of the transmitting window TW is less than a first width W1 between the first edges EG1 of the blocking layer BL. In this manner, the buffer layer 120 overlapping the transmitting window TW overlaps the blocking layer BL. Accordingly, when forming the transmitting window TW in the insulating layers disposed in the transmission area TA, since the buffer layer 120 is covered by the blocking layer BL, the buffer layer 120 may be prevented from being damaged. As such, the transmittance of the display device may be improved, while preventing damage to the buffer layer 120, which may prevent quality deterioration of the display device due to damaging the buffer layer 120.

Next, the display area PA will be described.

The buffer layer 120 is disposed on the substrate 110. The buffer layer 120 may be formed of a single layer including silicon nitride (SiNx) or a dual-layer structure including silicon nitride (SiNx) and silicon oxide (SiOx). The buffer layer 120 may planarize a surface of the substrate 110 and prevent permeation of impurities or moisture.

A switching semiconductor layer 135a and a driving semiconductor layer 135b spaced apart from each other are formed on the buffer layer 120.

The semiconductor layers 135a and 135b may include the same material as the blocking layer BL disposed in the transmission area TA.

The semiconductor layers 135a and 135b include a channel region not doped with impurities, and a source region and a drain region doped with impurities at respective sides of the channel region. The impurities may vary depending on the type of transistor, and may include an n-type impurity or a p-type impurity.

The switching semiconductor layer 135a includes a first channel region 1355a, and a first source region 1356a and a first drain region 1357a formed on respective sides of the first channel region 1355a. The driving semiconductor layer 135b includes a second channel region 1355b, and a second source region 1356b and a second drain region 1357b formed on respective sides of the second channel region 1355b.

The first channel region 1355a of the switching semiconductor layer 135a and the second channel region 1355b of the driving semiconductor layer 135b are not doped with impurities.

The source region 1356a, 1356b and the drain region 1357a, 1357b of the switching semiconductor layer 135a and the driving semiconductor layer 135b may include an impurity semiconductor doped with conductive impurities.

The first insulating layer 130 is disposed to overlap the first channel region 1355a of the switching semiconductor layer 135a and the second channel region 1355b of the driving semiconductor layer 135b. The first insulating layer 130 may include silicon nitride or silicon oxide.

A first switching control electrode 125a1, and the underlying first insulating layer 130 and the first channel region 1355a of the switching semiconductor layer 135a are self-aligned. A first driving control electrode 125b1, and the underlying first insulating layer 130 and the second channel region 1355b of the driving semiconductor layer 135b are self-aligned.

The first switching control electrode 125a1 is disposed on the first insulating layer 130 overlapping the first channel region 1355a of the switching semiconductor layer 135a. The first driving control electrode 125b1 is disposed on the first insulating layer 130 overlapping the second channel region 1355b of the driving semiconductor layer 135b. A first capacitor electrode 128a including the same material as the first switching control electrode 125a1 and the first driving control electrode 125b1 is disposed on the first insulating layer 130.

The first switching control electrode 125a1, the first driving control electrode 125b1, and the first capacitor electrode 128a may be floated or connected to a signal line to receive a predetermined voltage.

The second insulating layer 140 is formed on the switching semiconductor layer 135a, the driving semiconductor layer 135b, the first switching control electrode 125a1, the first driving control electrode 125b1, and the first capacitor electrode 128a.

The second insulating layer 140 may include silicon nitride or silicon oxide.

A gate line 121, a second switching control electrode 125a2, a second driving control electrode 125b2, and a second capacitor electrode 128b are disposed on the second insulating layer 140.

The first switching control electrode 125a1 and the second switching control electrode 125a2 form a switching control electrode 125a, and the first driving control electrode 125b1 and the second driving control electrode 125b2 form a driving control electrode 125b.

The gate line 121 extends in a horizontal direction and transmits a scan signal to the switching transistor T1. In this case, the gate line 121 is protruded toward the switching semiconductor layer 135a to be connected to the second switching control electrode 125a2.

The second driving control electrode 125b2 is connected to the second capacitor electrode 128b, which thereby protrudes toward the driving semiconductor layer 135b.

The interlayer insulating layer 160 is formed on the gate line 121, the second switching control electrode 125a2, the second driving control electrode 125b2, and the second capacitor electrode 128b. Like the first insulating layer 130 or the second insulating layer 140, the interlayer insulating layer 160 may include silicon nitride or silicon oxide.

The interlayer insulating layer 160 and the second insulating layer 140 have a first source contact hole 61a and a first drain contact hole 62a respectively exposing the first source region 1356a and the first drain region 1357a, a second source contact hole 61b and a second drain contact hole 62b respectively exposing the second source region 1356b and the second drain region 1357b, and a storage contact hole 63 exposing a part of the second capacitor electrode 128b.

A data line 171 including a switching source electrode 176a, a driving voltage line 172 including a driving source electrode 176b, a switching drain electrode 177a connected to the second capacitor electrode 128b, and a driving drain electrode 177b are formed on the interlayer insulating layer 160.

The data line 171 transmits the data signal and extends in the direction crossing the gate line 121. The driving voltage line 172 transmits the driving voltage. The driving voltage line 172 and the data line 171 extend in the same direction and are separated from each other.

The switching source electrode 176a is protruded toward the switching semiconductor layer 135a from the data line 171, and the driving source electrode 176b is protruded toward the driving semiconductor layer 135b from the driving voltage line 172.

The switching source electrode 176a is connected to the first source region 1356a through the first source contact hole 61a, and the driving source electrode 176b is connected to the second source region 1356b through the second source contact hole 61b. The switching drain electrode 177a faces the switching source electrode 176a and the driving drain electrode 177b faces the driving source electrode 176b.

The switching drain electrode 177a is connected to the first drain region 1357a through the first drain contact hole 62a, and the driving drain electrode 177b is connected to the second drain region 1357b through the second drain contact hole 62b. The switching drain electrode 177a extends to be electrically connected to the second capacitor electrode 128b and the second driving control electrode 125b2, through the storage contact hole 63 formed in the interlayer insulating layer 160. The first capacitor electrode 128a and the second capacitor electrode 128b overlap each other, thereby forming the storage capacitor Cst using the second insulating layer 140 as a dielectric material.

The switching semiconductor layer 135a, the switching control electrode 125a, the switching source electrode 176a, and the switching drain electrode 177a form the switching thin-film transistor T1. The driving semiconductor layer 135b, the driving control electrode 125b, the driving source electrode 176b, and the driving drain electrode 177b form the driving thin-film transistor T2.

The switching thin-film transistor T1 and the driving thin-film transistor T2 correspond to the switching element. The switching thin-film transistor T1 and the driving thin-film transistor T2 are formed in the display area PA.

The planarization layer 180 is formed on the switching source electrode 176a, the driving source electrode 176b, the switching drain electrode 177a, and the driving drain electrode 177b. The planarization layer 180 serves to remove and planarize a step, in order to increase emission efficiency of the organic light emitting element to be formed thereon.

The planarization layer 180 may include a polyacryl-based resin, an epoxy resin, a phenolic resin, a polyamide-based resin, a polyimide-based resin, an unsaturated polyester-based resin, a polyphenylene-based resin, a polyphenylene sulfide-based resin, a siloxane-based resin, or a silica-based inorganic.

The pixel electrode 710 is disposed on the planarization layer 180. The pixel electrode 710 may include a transparent conductive material, such as indium tin oxide (ITO), indium zinc oxide (IZO), zinc oxide (ZnO), or indium oxide ($In_2O_3$), or a reflective metal, such as lithium (Li), calcium (Ca), lithium fluoride/calcium (LiF/Ca), lithium fluoride/aluminum (LiF/Al), aluminum (Al), silver (Ag), magnesium (Mg), or gold (Au).

The pixel electrode 710 is electrically connected to the driving drain electrode 177b of the driving thin-film transistor T2 through a contact hole 181 formed in the planarization layer 180, thereby being the anode of the organic light emitting element 70.

The pixel defining layer 350 is formed on the planarization layer 180 and the edge of the pixel electrode 710.

The pixel defining layer 350 has an opening exposing the pixel electrode 710. The pixel defining layer 350 may include a polyacryl-based resin, a polyimide-based resin, a siloxane-based resin, or a silica-based inorganic material.

An organic emission layer 720 is formed in the opening of the pixel defining layer 350.

The organic emission layer 720 is formed of a multilayer including an emission layer and one or more of a hole-injection layer (HIL), a hole-transporting layer (HTL), an electron-transporting layer (ETL), and an electron-injection layer (EIL).

When the organic emission layer 720 includes all the layers, the hole-injection layer is disposed on the pixel electrode 710 as an anode, and the hole-transporting layer, the emission layer, the electron-transporting layer, and the electron-injection layer may be sequentially disposed (or laminated) thereon.

The organic emission layer 720 may include a red organic emission layer emitting red light, a green organic emission layer emitting green light, and a blue organic emission layer emitting blue light. The red organic emission layer, the green organic emission layer, and the blue organic emission layer are formed in a red pixel, a green pixel, and a blue pixel, respectively, thereby implementing a color image.

Further, the organic emission layer 720 may implement the color image by laminating the red organic emission layer, the green organic emission layer, and the blue organic emission layer together in the red pixel, the green pixel, and the blue pixel, and forming a red color filter, a green color filter, and a blue color filter for each pixel.

As another example, white organic emission layers emitting white light are formed in all of the red pixel, the green pixel, and the blue pixel, and a red color filter, a green color filter, and a blue color filter are formed for each pixel, thereby implementing the color image. In the case of implementing the color image by using the white organic emission layer and the color filters, a deposition mask for depositing the red organic emission layer, the green organic emission layer, and the blue organic emission layer on respective pixels, that is, the red pixel, the green pixel, and the blue pixel, may not be utilized.

The white organic emission layer may include one organic emission layer, and has a configuration of emitting white light by laminating organic emission layers. For example, the white organic emission layer may have a configuration for emitting white light by combining at least one yellow organic emission layer and at least one blue organic emission layer, at least one cyan organic emission layer and at least one red organic emission layer, at least one magenta organic emission layer and at least one green organic emission layer, or the like.

A common electrode 730 is formed on the pixel defining layer 350 and the organic emission layer 720. The common electrode 730 may include a transparent conductive material such as ITO, IZO, ZnO, or $In_2O_3$, or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au).

The common electrode 730 may be the cathode of the organic light emitting element 70. As described above, the pixel electrode 710, the organic emission layer 720, and the common electrode 730 form the organic light emitting element 70.

In the display device according to the present exemplary embodiment, the common electrode 730 is disposed in the display area PA and not disposed in the transmission area TA. As described above, if the common electrode 730 is only formed in the display area PA, the light is prevented from being reflected by the common electrode 730, thereby improving the transmittance of the transparent display device.

An overcoat (not shown) protecting the organic light emitting element 70 may be formed on the common electrode 730. The overcoat may be disposed in the display area PA and the transmission area TA.

As described above, in the display device according to the present exemplary embodiment, the transmitting window TW is formed to overlap the blocking layer BL, and the width between the edges of the transmitting window TW is formed to be smaller than the width between the edges of the blocking layer BL. Accordingly, the buffer layer 120 overlapping the transmitting window TW overlaps the blocking layer BL. When forming the transmitting window TW formed in the insulating layers disposed in the transmission area TA, the buffer layer 120 is covered by the blocking layer BL, thereby preventing the buffer layer 120 from being damaged. Accordingly, the transmittance of the display device may be improved, while the damage of the buffer layer 120 may be prevented, thereby preventing the quality deterioration of the display device due to the damage of the buffer layer 120.

Figure 7:
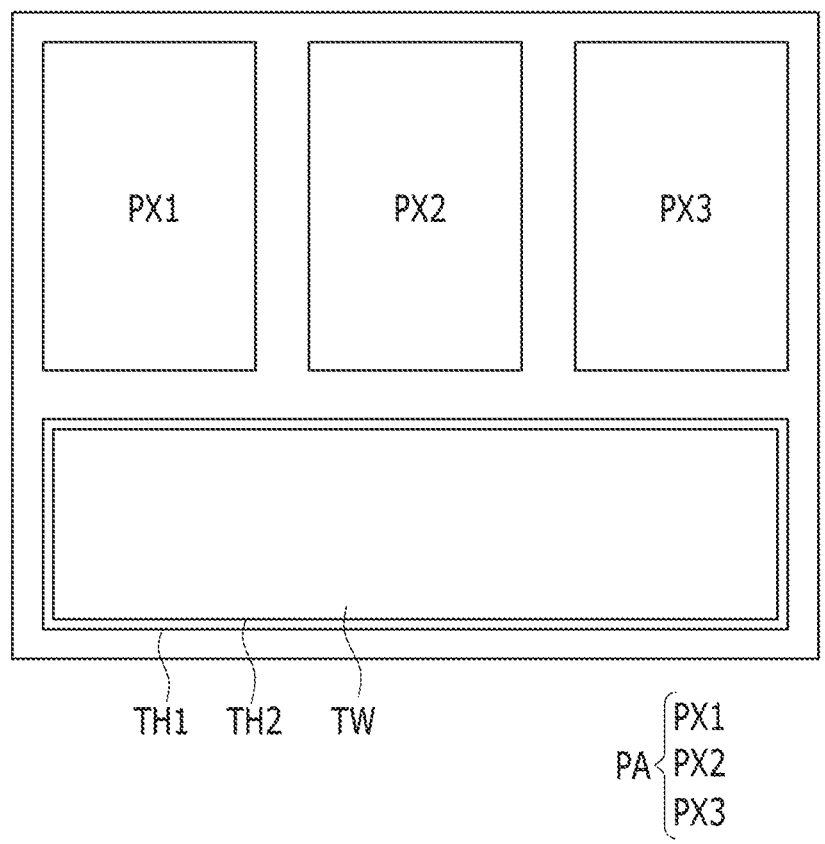
FIG. 7 is a layout view of a display device according to an exemplary embodiment.
Figure 8:
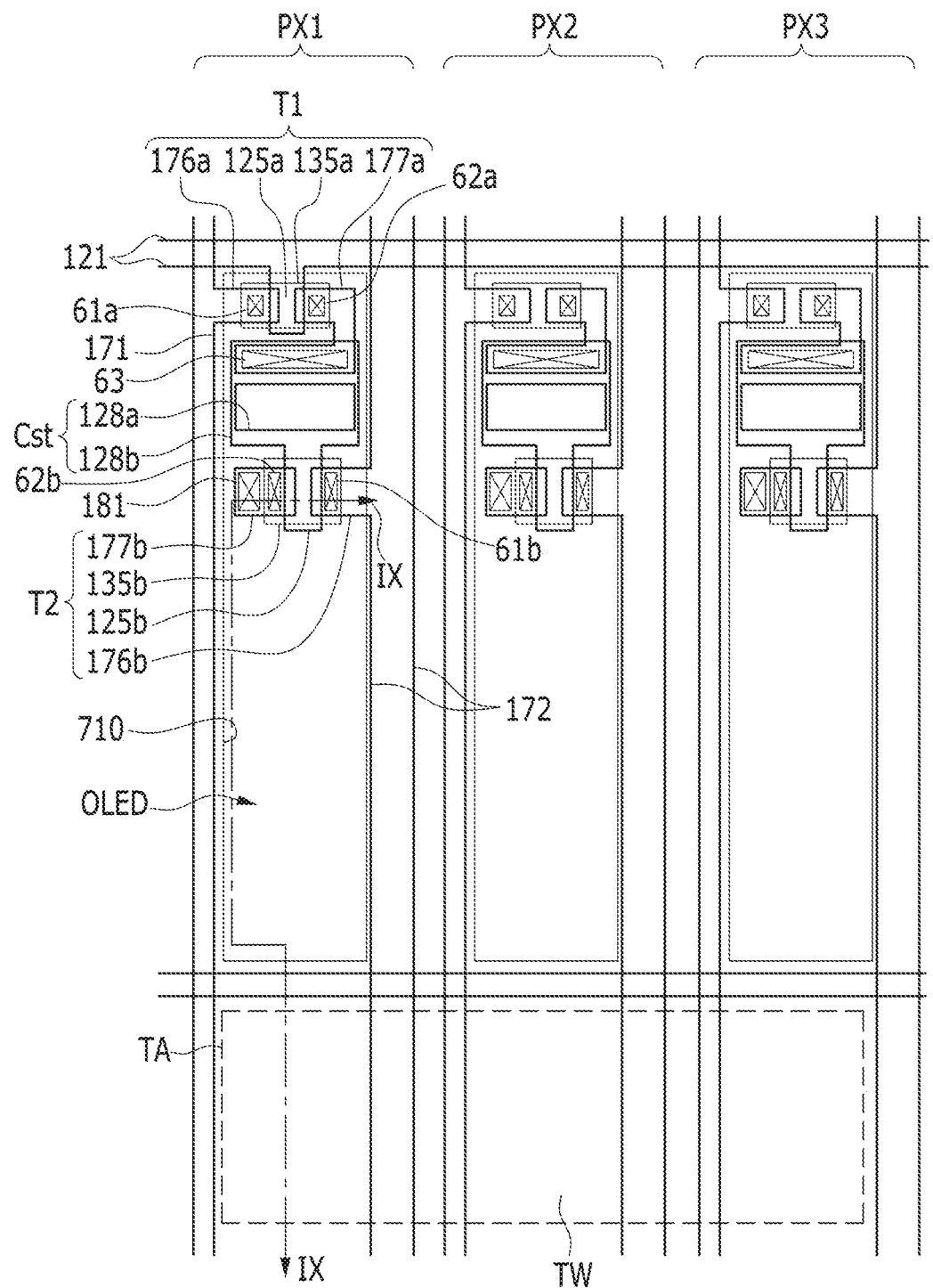
FIG. 8 is a layout view showing pixel areas of a display device according to an exemplary embodiment.
Figure 9:
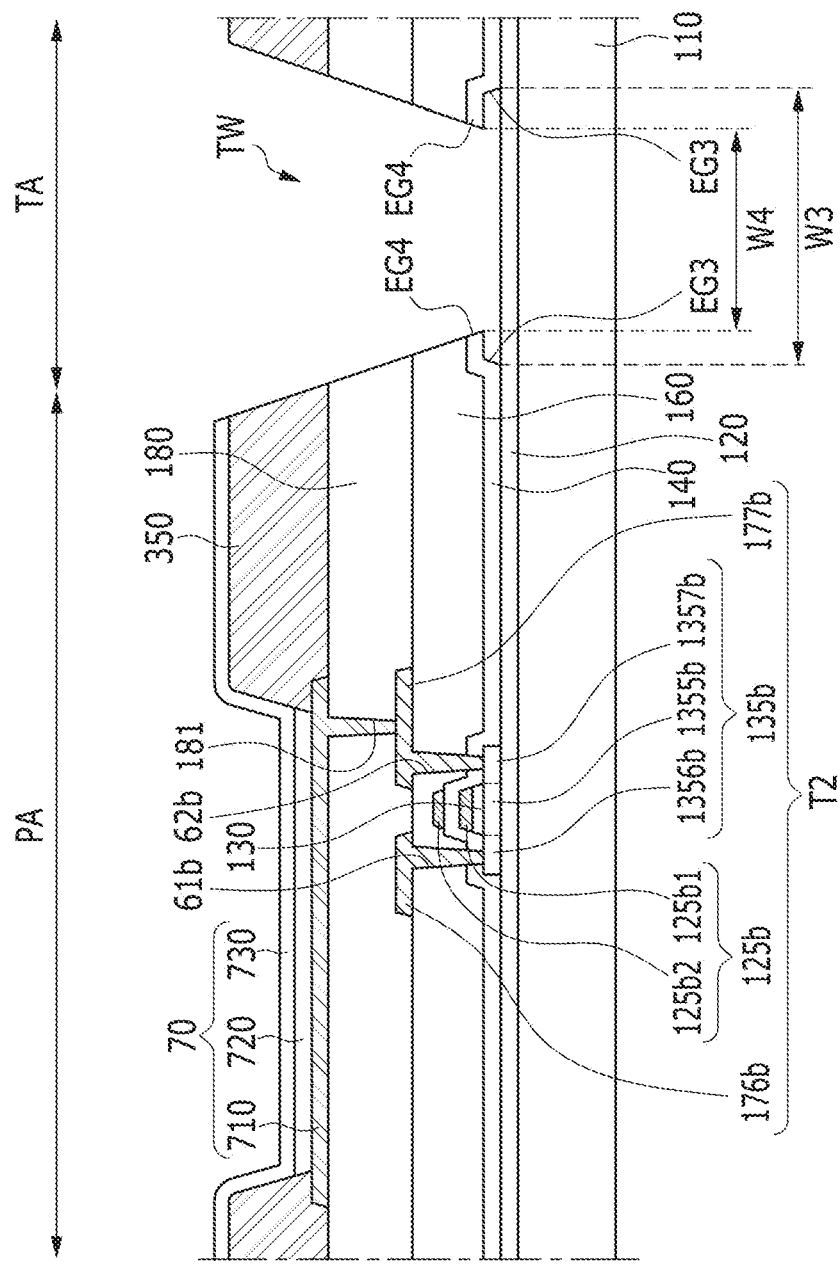
FIG. 9 is a cross-sectional view of the display device of FIG. 8 taken along line IX-IX'.

Hereinafter, the display device according to an exemplary embodiment will be described with reference to FIG. 7 to FIG. 9. FIG. 7 is a layout view of a display device according to an exemplary embodiment. FIG. 8 is a layout view showing pixel areas of a display device according to an exemplary embodiment. FIG. 9 is a cross-sectional view of the display device of FIG. 8 taken along line IX-IX'.

Referring to FIG. 7, a configuration and constituent elements of the display device according to the present exemplary embodiment may be substantially similar to the display device illustrated with reference to FIG. 1. Accordingly, repeated description thereof will be omitted.

The display device according to the present exemplary embodiment includes a display area PA displaying the image and a transmission area TA transmitting the light.

The display area PA includes pixels PX1, PX2, and PX3. The pixels PX1, PX2, and PX3 may display different colors from each other, and the pixels PX1, PX2, and PX3 may form one dot. The pixels PX1, PX2, and PX3 may include the first pixel PX1 displaying the first color, the second pixel PX2 displaying the second color, and the third pixel PX3 displaying the third color.

The transmission area TA is an area transmitting light, and the transmitting window TW is formed in the transmission area TA. The transmitting window TW includes a first transmission hole TH1 and a second transmission hole TH2. The first transmission hole TH1 is a transmission hole near the substrate 110, and the second transmission hole TH2 is a transmission hole connected to the first transmission hole TH1.

The edge of the first transmission hole TH1 and the edge of the second transmission hole TH2, as illustrated with reference to FIG. 7, are the edges measured in the adjacent portions of the first transmission hole TH1 and the second transmission hole TH2. In the adjacent portions of the first transmission hole TH1 and the second transmission hole TH2, the edge of the first transmission hole TH1 is protruded further than the edge of the second transmission hole TH2.

The ratio of the area of the transmission area TA to the entire area of the display area PA and the transmission area TA may be in the range of about 20% to about 70%.

In the display device according to the present exemplary embodiment, one transmitting window TW of the transmission area TA is formed in the pixels PX1, PX2, and PX3. It is noted that, however, the transmitting window TW of the transmission area TA may be separately formed in each pixel area.

Hereinafter, one example of the display device of FIG. 7 will be described in detail with reference to FIG. 8 and FIG. 9.

First, the transmission area TA will be described.

The transmission area TA includes the buffer layer 120 disposed on the substrate 110 and the transmitting window TW overlapping the buffer layer 120.

The substrate 110 may be flexible, and may include an organic material, an inorganic material, a glass, or a metal, such as stainless steel. The substrate 110 may be flexible, but it is not limited thereto, and it may be stretchable, foldable, bendable, or rollable. Since the substrate 110 is flexible, stretchable, foldable, bendable, or rollable, the display device may be flexible, stretchable, foldable, bendable, or rollable.

The transmitting window TW is an opening, which is formed in insulating layers, such as a second insulating layer 140, an interlayer insulating layer 160, a planarization layer 180, and a pixel defining layer 350 disposed in the display area PA and the transmission area TA. The transmitting window TW is formed to penetrate the second insulating layer 140, the interlayer insulating layer 160, the planarization layer 180, and the pixel defining layer 350.

The transmitting window TW includes the first transmission hole TH1 adjacent to the substrate 110 and the second transmission hole TH2 connected to the first transmission hole TH1. A third width W3 of a third edge EG3 of the first transmission hole TH1 is greater than a fourth width W4 of a fourth edge EG4, which is an edge of the second transmission hole TH2 adjacent to the first transmission hole TH1. That is, the third edge EG3 of the first transmission hole TH1 is protruded farther than the fourth edge EG4 of the second transmission hole TH2 adjacent to the first transmission hole TH1. A width of the fourth edge EG4 of the second transmission hole TH2 may be widened, as a distance to the substrate 110 increases. In this manner, the transmitting window TW has an inversely tapered structure along the direction away from the substrate 110, in a portion adjacent to the substrate 110, and then has a positively tapered structure, in a portion farther away from the substrate 110.

The display device according to the present exemplary embodiment may include the transmitting window TW formed in the insulating layers disposed in the transmission area TA, which may increase the transmittance of external light.

When forming the transmitting window TW in the insulating layers disposed in the transmission area TA, the buffer layer 120 may be etched, which may damage the buffer layer 120. As such, an unnecessary component, such as impurities or moisture, is penetrated, which may deteriorate the quality of the display device.

According to the present exemplary embodiment, when forming the transmitting window TW, the insulating layers are etched to form the transmitting window TW after forming the semiconductor layer (not shown) on the region overlapping the transmitting window TW. The semiconductor layer is formed wider than the region where the transmitting window TW will be formed. After forming the transmitting window TW in the insulating layers, the semiconductor layer disposed in the region overlapping the transmitting window TW is removed.

In this manner, when forming the transmitting window TW in the insulating layers disposed in the transmission area TA, since the buffer layer 120 is covered by the semiconductor layer, the buffer layer 120 may be prevented from being damaged. After forming the transmitting window TW, the semiconductor layer covering the buffer layer 120 is removed, which may increase the transmittance of the transmission area TA of the display device.

In addition, before forming the transmitting window TW, the semiconductor layer is formed to be wider than the region where the transmitting window TW will be formed on the buffer layer 120. The insulating layers are deposited thereon, the transmitting window TW is formed in the insulating layers, and then the semiconductor layer is removed. In this manner, the first transmission hole TH1 is formed at the portion where the removed semiconductor layer has been formed.

In this manner, since the area of the semiconductor layer formed before forming the transmitting window TW is greater than the area of the transmitting window TW, the third edge EG3 of the first transmission hole TH1, which is formed in the region where the semiconductor layer has been formed, is protruded farther than the fourth edge EG4 of the adjacent second transmission hole TH2. Accordingly, the transmitting window TW has an inversely tapered structure along the direction away from the substrate 110, in a portion adjacent to the substrate 110, and then has a positively tapered structure, in a portion farther from the substrate 110.

In this manner, the transmittance of the display device may be increased by removing the semiconductor layer, which is formed in the transmission area TA. Also, since the buffer layer 120 is prevented from the damage while forming the transmitting window TW, the quality deterioration of the display device due to the damage of the buffer layer 120 may be prevented.

As shown in FIG. 7 to FIG. 9, a configuration and constituent elements of the display area PA of the display device according to the present exemplary embodiment may be substantially similar to those of the display area PA of the display device illustrated with reference to FIG. 1 to FIG. 6. Accordingly, repeated description thereof will be omitted, in order to avoid obscuring exemplary embodiments described herein.

As described above, according to the display device according to the present exemplary embodiment, the semiconductor layer is disposed on the buffer layer 120, and the insulating layers are disposed on the buffer layer 120. The transmitting window TW is formed in the insulating layers, and then the semiconductor layer is removed. In this manner, the buffer layer 120 may be prevented from damage while increasing the transmittance of the display device, thereby preventing the quality deterioration of the display device due to the damage of the buffer layer 120.

Figure 10A:
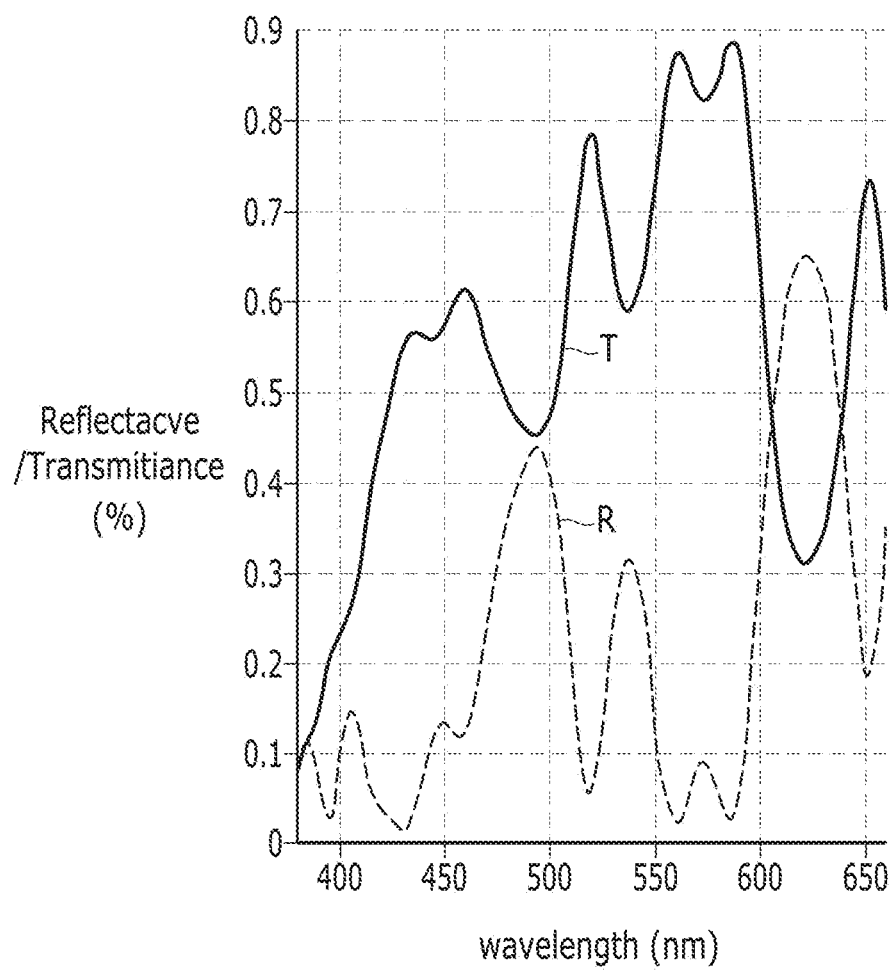
FIG. 10A, FIG. 10B, and FIG. 10C are graphs showing results of an experimental example.
Figure 10B:
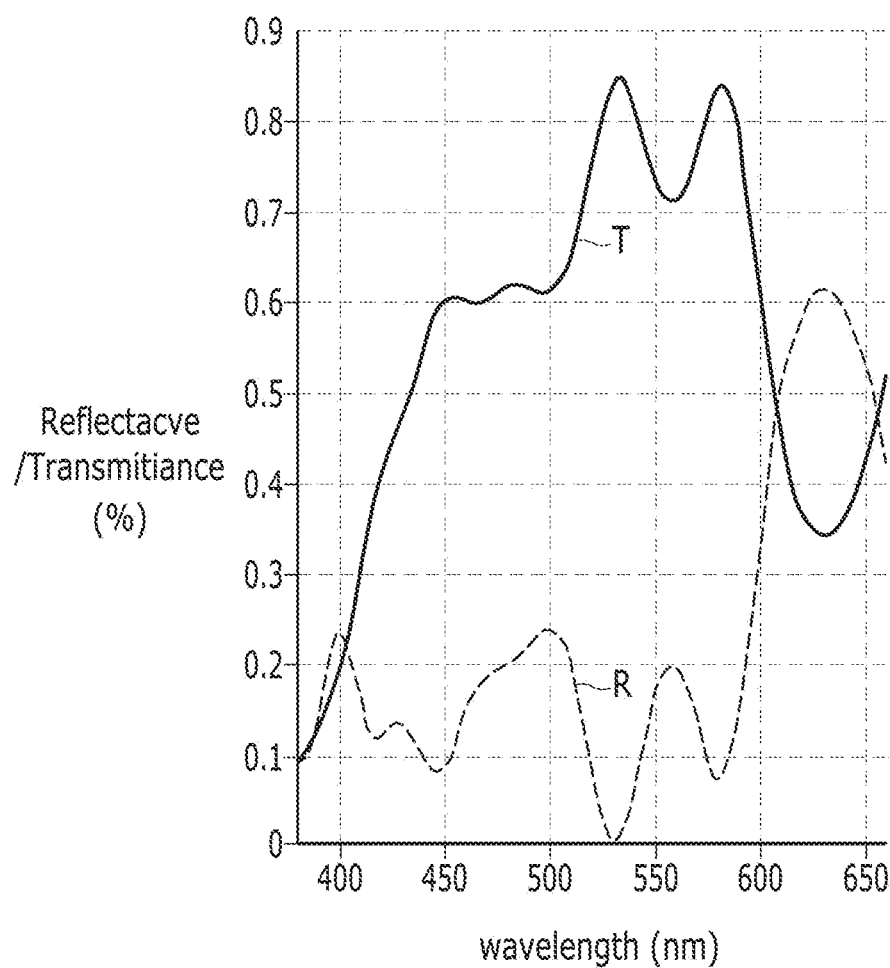
Figure 10C:
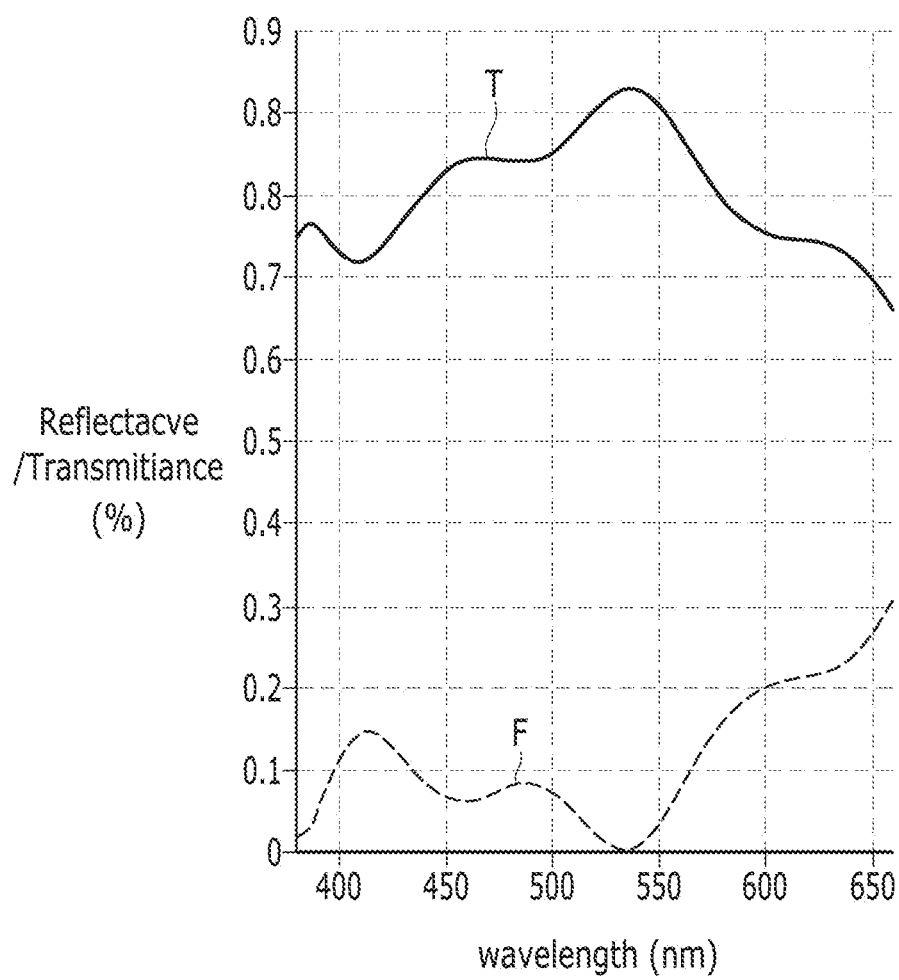

Next, an experimental example according to an exemplary embodiment will be described with reference to FIG. 10A to FIG. 10C. FIG. 10A to FIG. 10C are graphs showing results of the experimental example.

In the present experimental example, a first case includes the transmitting window TW not formed in the transmission area TA. A second case includes the transmitting window TW and the semiconductor layer overlapping the transmitting window TW, similar to the display device illustrated with reference to FIG. 1 to FIG. 6. A third case includes the semiconductor layer formed on the buffer layer 120 before forming the transmitting window TW and the semiconductor layer is removed after forming the transmitting window TW, similar to the display device illustrated with reference to FIG. 7 to FIG. 9.

The reflectance of the light according to the wavelength of the light incident to the display device and the transmittance are measured, and results thereof are shown in FIG. 10A to FIG. 10C. FIG. 10A shows the result of the first case, FIG. 10B shows the result of the second case, and FIG. 10C shows the result of the third case. In FIG. 10A to FIG. 10C, the reflectance of light according to the wavelength of the light incident to the display device is indicated by R, and the transmittance is indicated by T.

Referring to FIG. 10A to FIG. 10C, the second case and the third case have small reflectance of external light and high transmittance, as compared to the first case.

According to exemplary embodiments, the buffer layer 120 may be prevented from damage, thereby preventing the quality deterioration of the display device due to the damage of the buffer layer 120 and simultaneously increasing the transmittance of the display device.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A display device, comprising:
    a substrate comprising a first area displaying an image and a second area adjacent to the first area, the second area transmitting external light;
    a first electrode and a second electrode disposed in the first area and overlapping each other;
    an emission layer disposed between the first electrode and the second electrode in the first area;
    a first semiconductor layer disposed in the first area; and
    a second semiconductor layer disposed in the second area, wherein the second semiconductor layer is not connected to the first electrode and the second electrode.

2. The display device of claim 1, wherein the first semiconductor layer and the second semiconductor layer comprise an oxide semiconductor.

3. The display device of claim 2, further comprising insulating layers disposed on the first semiconductor layer, the insulating layers comprising a hole disposed in the second area.

4. The display device of claim 3, wherein an edge of the hole overlaps the second semiconductor layer.

5. The display device of claim 4, wherein the substrate is flexible.

6. The display device of claim 3, further comprising a buffer layer disposed on the substrate,
    wherein the second semiconductor layer is disposed on the buffer layer.

7. The display device of claim 6, wherein a portion of the buffer layer overlapping the hole is covered by the second semiconductor layer.

8. The display device of claim 7, wherein the substrate is flexible.

9. The display device of claim 2, further comprising a buffer layer disposed on the substrate, the buffer layer being disposed in the first area and the second area.

10. The display device of claim 9, wherein the substrate is flexible.

11. The display device of claim 1, further comprising insulating layers disposed on the first semiconductor layer, the insulating layers comprising a hole in the second area.

12. The display device of claim 11, wherein the hole comprises an edge overlapping the second semiconductor layer.

13. The display device of claim 12, wherein the substrate is flexible.

14. The display device of claim 11, further comprising a buffer layer disposed on the substrate,
    wherein the second semiconductor layer is disposed on the buffer layer.

15. The display device of claim 14, wherein a portion of the buffer layer overlapping the hole is covered by the second semiconductor layer.

16. The display device of claim 15, wherein the substrate is flexible.

17. The display device of claim 1, further comprising a buffer layer disposed on the substrate, the buffer layer being disposed in the first area and the second area.

18. The display device of claim 17, wherein the substrate is flexible.

19. A display device, comprising:
    a substrate comprising a first area displaying an image and a second area adjacent to the first area, the second area transmitting external light;
    a buffer layer disposed directly on the substrate;
    a first electrode and a second electrode disposed in the first area and overlapping each other;
    an emission layer disposed between the first electrode and the second electrode in the first area;
    a semiconductor layer disposed in the first area; and
    insulating layers disposed on the semiconductor layer,
    wherein:
    the insulating layers comprise a hole disposed in the second area;
    the hole comprises a first hole portion and a second hole portion adjacent to the first hole portion, the first hole portion being directly on the buffer layer;
    a width of the first hole portion is greater than a width of the second hole portion.

20. The display device of claim 19, wherein the buffer layer is disposed in the first area and the second area.

21. The display device of claim 20, wherein the semiconductor layer is disposed directly on the buffer layer.

22. The display device of claim 21, wherein the semiconductor layer comprises an oxide semiconductor.

23. The display device of claim 22, wherein the substrate is flexible.

24. The display device of claim 19, wherein the semiconductor layer includes an oxide semiconductor.

25. The display device of claim 24, wherein the substrate is flexible.

26. A display device, comprising:
    a substrate comprising a first area displaying an image and a second area adjacent to the first area;
    a buffer layer disposed on the substrate;
    a semiconductor layer disposed on the buffer layer in the second area;
    a first electrode and a second electrode disposed in the first area and overlapping each other; and
    an emission layer disposed between the first electrode and the second electrode in the first area,
    wherein the semiconductor layer is disposed directly on the buffer layer in the second area.

27. The display device of claim 26, wherein the semiconductor layer comprises an oxide semiconductor.

* * * * *